(12) United States Patent
Parkhurst

(10) Patent No.: US 7,135,927 B2
(45) Date of Patent: Nov. 14, 2006

(54) ULTRA FAST, LOW NOISE OPERATIONAL AMPLIFIER WITH DYNAMIC BIASING

(75) Inventor: Charles Parkhurst, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/736,178

(22) Filed: Dec. 15, 2003

(65) Prior Publication Data

US 2005/0128000 A1    Jun. 16, 2005

(51) Int. Cl.
*H03F 3/45* (2006.01)
(52) U.S. Cl. ..................... 330/255; 330/263; 330/267
(58) Field of Classification Search ................ 330/255
See application file for complete search history.

(56) References Cited

U.S. PATENT DOCUMENTS 5,323,121 A * 6/1994 Butler ......................... 330/261
5,512,859 A * 4/1996 Moraveji ..................... 330/267
6,542,032 B1 * 4/2003 Escobar-Bowser et al. .. 330/255
6,710,654 B1 * 3/2004 Parkhurst et al. ........... 330/252
6,710,655 B1 * 3/2004 Parkhurst et al. ........... 330/252

* cited by examiner

*Primary Examiner*—Khanh Van Nguyen
(74) *Attorney, Agent, or Firm*—W. James Brady; Frederick J. Telecky, Jr.

(57) ABSTRACT

The present invention achieves technical advantages as an operational amplifier (30) having both a high slew rate and a full power bandwidth with low distortion by providing resistors (R6, R7, R9, R10) in place of active loads coupled to a differential pair (Q22, Q25, and Q23, Q24) of transistors in a folded cascode input stage (34). By utilizing passive resistors instead of active loads, no saturation occurs during high slew rate signals. The present invention achieves technical advantages of higher slew rate and lower noise without sacrificing power consumption.

8 Claims, 5 Drawing Sheets

ULTRA FAST, LOW NOISE OPERATIONAL AMPLIFIER WITH DYNAMIC BIASING

RELATED PATENT APPLICATIONS

Cross reference is made to commonly assigned U.S. patent application Ser. No. 09/999,475 filed Dec. 3, 2001 and entitled "Bipolar Class AB Folded Cascode Operational Amplifier for High-Speed Applications" the teachings of which are incorporated herein by reference.

FIELD OF THE INVENTION

The present invention is related to operational amplifiers, and more particularly to high slew rate operational amplifiers with extremely low distortion.

BACKGROUND OF THE INVENTION

High speed operational amplifiers (op amps) are required to have high slew rates so that the full power bandwidth is higher and as a consequence lower distortion is achieved at higher frequencies and/or higher signal amplitudes. Unfortunately, current solutions increase full power bandwidth by sacrificing noise performance in the amplifier thus limiting the resolution of the output signal.

An example of such a solution is the widely known class AB input stage shown at 10 in FIG. 1. The input stage 12 is fast, but its noise performance is not as good when compared to single differential pair inputs. The reason for this is the amount of transistors that are required at the input, shown at transistors Q1 to Q8. Lower noise can be achieved in this input stage 12, but at the expense of quiescent current or more general power.

An alternative solution is shown in FIG. 2 at 20 and uses a dynamic biasing scheme that provides extra current to a differential pair in a folded cascode input stage, the teachings of which are incorporated herein by reference. This circuit 20 accomplishes the task of having higher full power bandwidth without sacrificing noise performance and power in the amplifier. In this design the amount of current available during a high slew signal is limited by the active loads feeding the folded part of the circuit, shown at transistors Q82 and Q62. These two transistors run out of VCE during a fast signal and therefore they will enter in the saturation region, decreasing the linearity of the amplifier.

This limitation calls for a new dynamically biased circuit that does not suffer from saturation during high slew signals and yet maintains low noise operation without trading off power.

SUMMARY OF THE INVENTION

The present invention achieves technical advantages as an operational amplifier having both a high slew rate and a full power bandwidth with low distortion by providing resistors in place of active loads of a differential pair of transistors in a folded cascode input stage. By utilizing passive resistors instead of active loads, no saturation occurs during high slew rate signals. The present invention achieves technical advantages of higher slew rate and lower noise without sacrificing power consumption. While more transistors are required for the operational amplifier of the present invention when compared to other architectures, there is no significant sacrifice in power consumption. This is due to the fact that dynamic bias circuit feeding the input stage does not have to be large to lower the noise at the input stage. The noise contribution of the dynamic bias stage is completely negligible with respect to the rest of the amplifier because it does not have gain from the input to the output of the operational amplifier.

DETAILED DESCRIPTION OF THE PREFERRED EMBODIMENT

Figure 3:
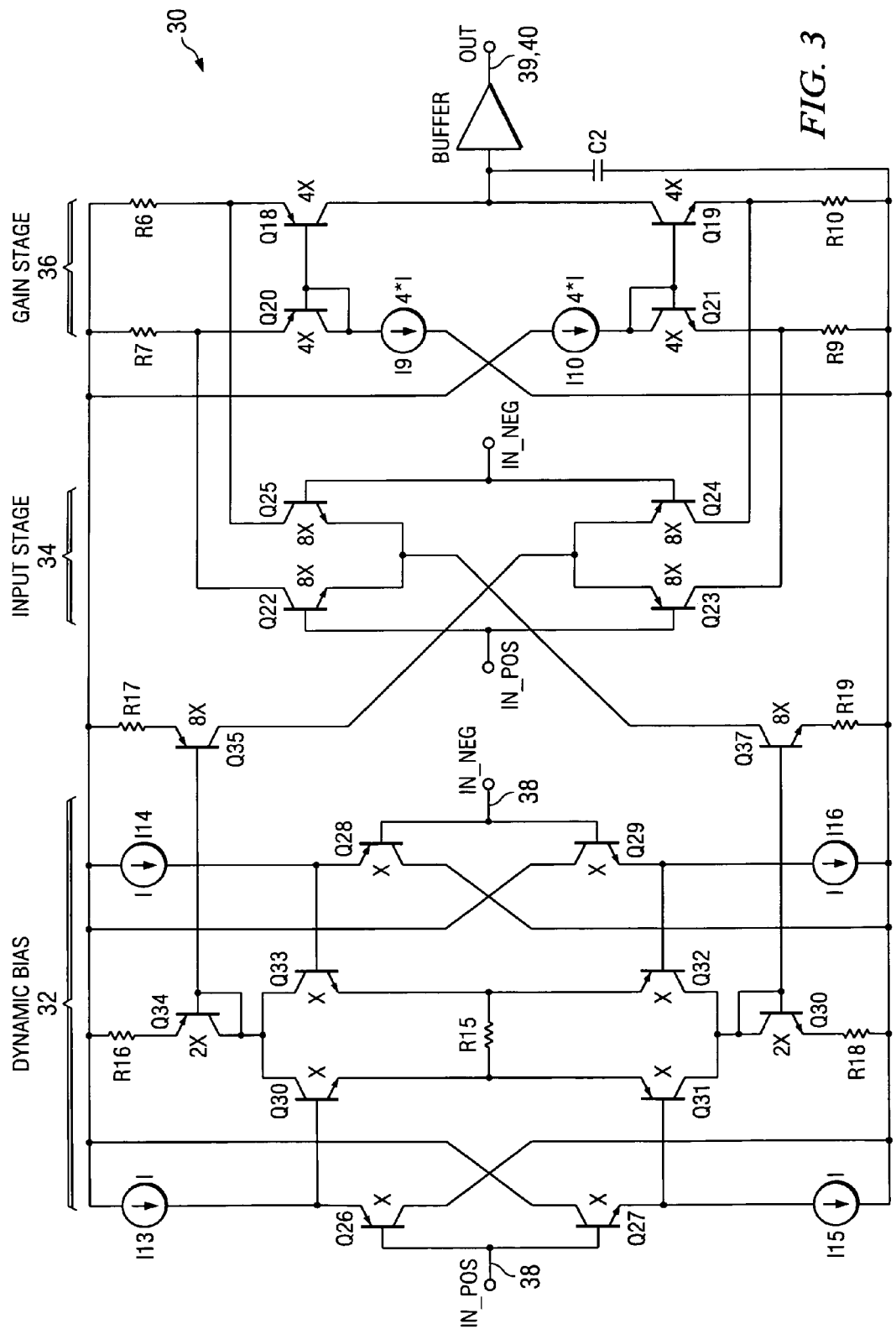
FIG. 3 is an electrical schematic of a low noise, high slew rate operational amplifier utilizing resistors in place of active loads in a differential pair in a folded cascode input stage.

An operational amplifier that does not suffer from saturation during high slew rate signals and maintains low noise operation without trading off power is shown at 30 in FIG. 3. This circuit 30 uses resistors instead of active loads. Advantageously, no saturation occurs during fast signals, and circuit 30 accomplishes higher slew rate and lower noise performance without sacrificing power consumption. More transistors are required in amplifier 30 when compared to the circuits 10 and 20, but no significant sacrifice is observed in its power consumption. This is due to the fact that the dynamic bias circuit 32 does not have to be large to lower the noise at the input stage 34. The noise contribution of the dynamic bias stage 32 is completely negligible to the rest of the amplifier 30 including gain stage 36 because it does not have gain from the differential input 38 to the output 39 of the amplifier.

Figure 1:
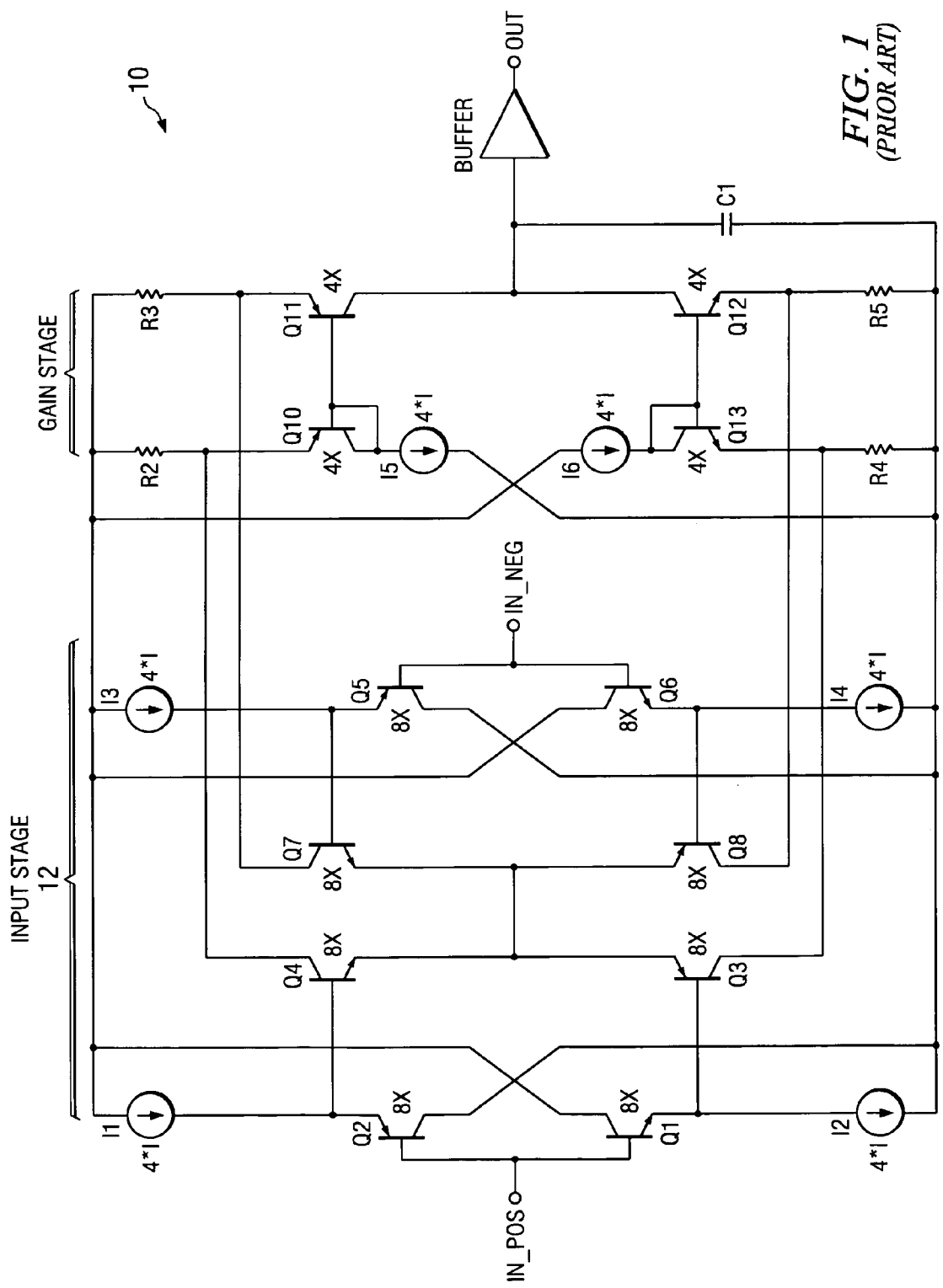
FIG. 1 is an electrical schematic of a conventional Class AB input stage.

The circuit 30 in FIG. 3 accomplishes very low noise because the input stage 34 is composed of two differential pairs of transistors Q22, Q25 and Q23, Q24 instead of a typical class AB input stage, such as circuit 10 in FIG. 1, that has more transistors that increase the noise. Increased speed is obtained by the advantageous use of the dynamic bias circuit 32 composed of transistors Q26–Q33 in combination with this input stage 34. Current sources comprised of transistors Q34, Q35 and Q30, Q37 source and sink dynamic current into the differential pairs of transistors Q22, Q25 and Q23, Q24, respectively. When a voltage difference is developed across the inputs IN_POS and IN_NEG at 38, the currents provided to the emitters of the differential pairs of transistors responsively increases exponentially. This means that the higher the input differential voltage at input 38, the higher the respective differential pair collector currents. Advantageously, these dynamic collector currents are then put through emitter resistors R7, R6 and R9, R10 in the output stage 36. Changing the current through these emitter resistors responsively changes the base emitter voltages of output transistors Q18 and Q19. Advantageously, this change in base emitter voltage is translated in an exponential change in collector current that charges or discharges the compensation capacitor C2. As a result, the amplifier 30 slew rate is increased because there is more current available to charge and discharge the compensation capacitor C2.

To appreciate the advantages of the present invention, the embodiment of FIG. 3 is compared to other op amp designs.

Figure 2:
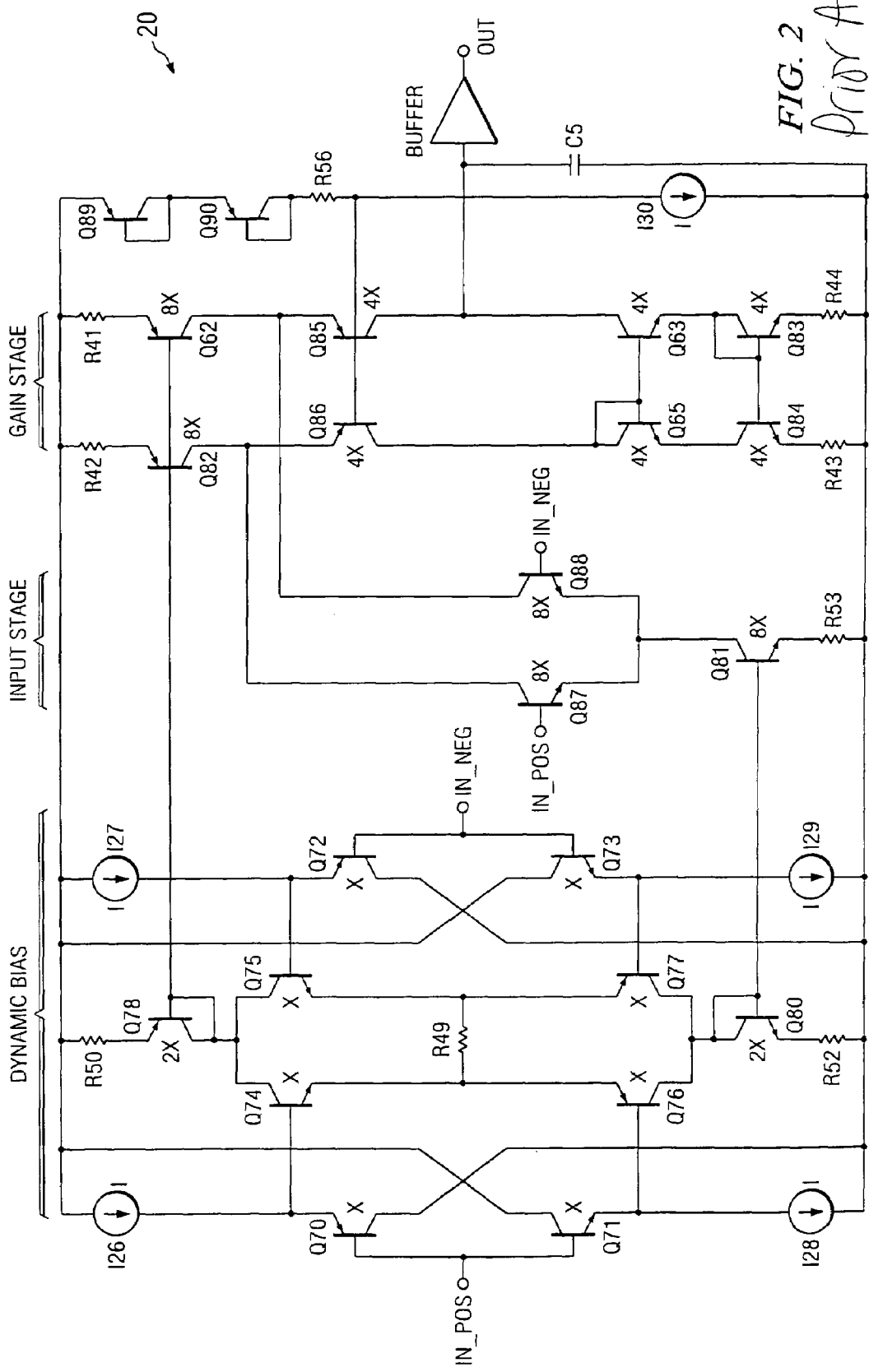
FIG. 2 is an electrical schematic of a dynamically biased folded cascode operational amplifier disclosed in Applicant's co-pending patent application.

For this comparison, the same transconductance for all of the transistors in the respective signal paths which attain the lowest noise possible in all architectures (class AB, dynamically biased folded cascode and circuit 30) is used. Plots of noise and slew rate, along with the power consumption for each circuit, are provided in FIG. 4. For these plots, there is a reference architecture called conventional circuit without dynamic biasing. The purpose of this reference is to show the advantages that the dynamic bias circuit 30 has over a classic differential pair designs, plotted at 42, used as an input stage. Transistor sizes, ratios and relative current values are shown for each FIG. 1–3 using variable "X".

Figure 4:
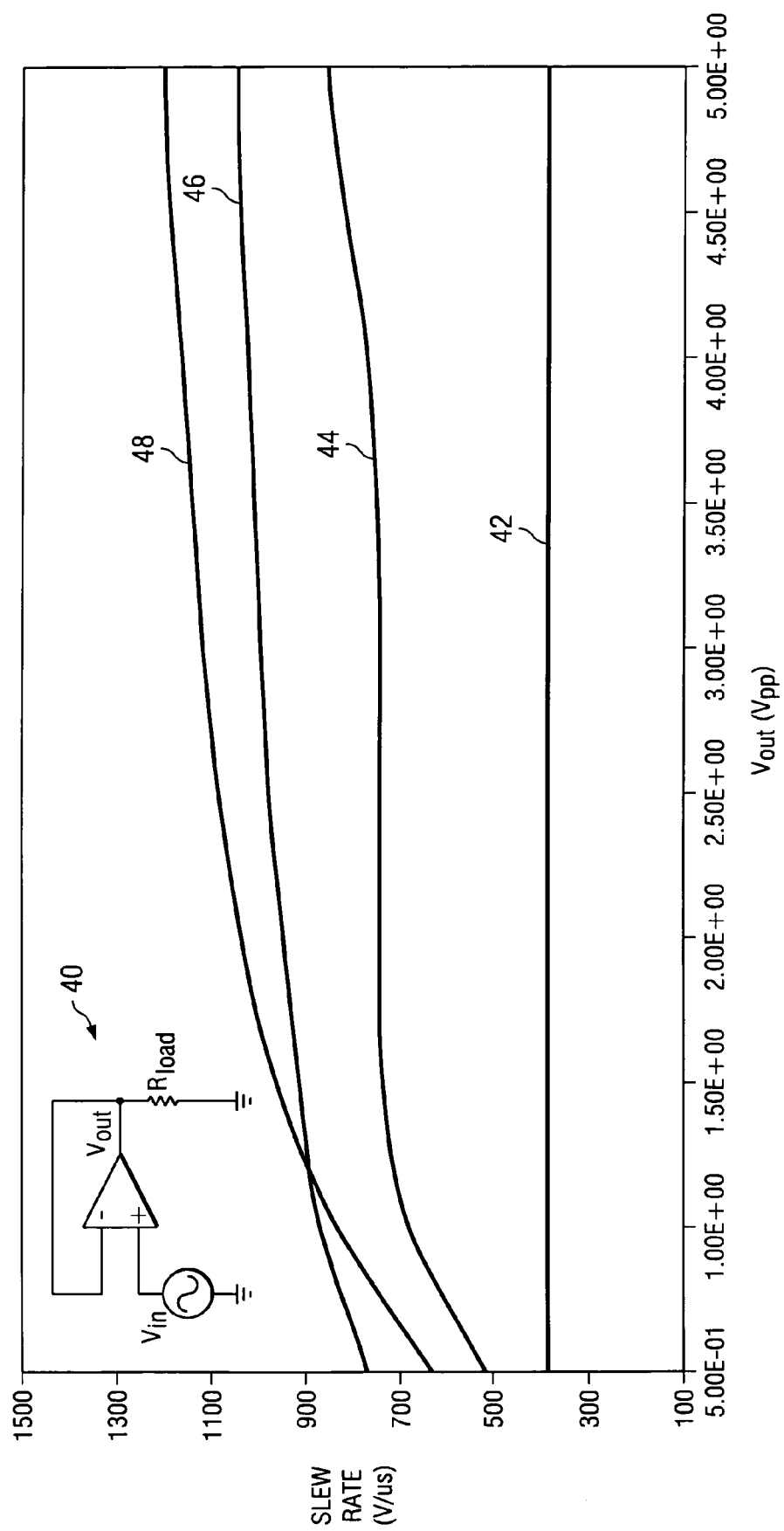
FIG. 4 is a chart plotting the slew rate versus the output voltage of the present invention in view of other designs.

FIG. 4 shows the Slew Rate vs Vout for the circuits 10, 20 and 30, compared to a conventional circuit shown at 40 and plotted at 42. It is noted that the dynamically biased folded cascode circuit 20, plotted at 44, has less slew rate than the Class AB circuit 10, shown at 46, and circuit 30, plotted at 48. This is due to the saturation problem described above. Advantageously, circuit 30 exhibits the highest slew rate at maximum output voltage, and it is at the same time larger than the slew rate of the Class AB circuit 10.

It is customary to introduce a resistor between the emitters of Q3, Q4, Q7 and Q8 to reduce the GM of the gain stage, and as a consequence, less capacitance is required to compensate the amplifier which results in higher slew rate. This makes the resistor a design knob for slew rate in the Class AB amplifier 10. Unfortunately, noise increases with the addition of this resistor. A similar effect can be obtained in circuit 30 by adding resistors at the emitters of Q22, Q23, Q24 and Q25. The addition of these resistors also introduces local feedback on the transistors which helps to reduce the distortion of the overall amplifier. Circuit 30 does not include these degeneration resistors because the design is targeted to low noise.

Figure 5:
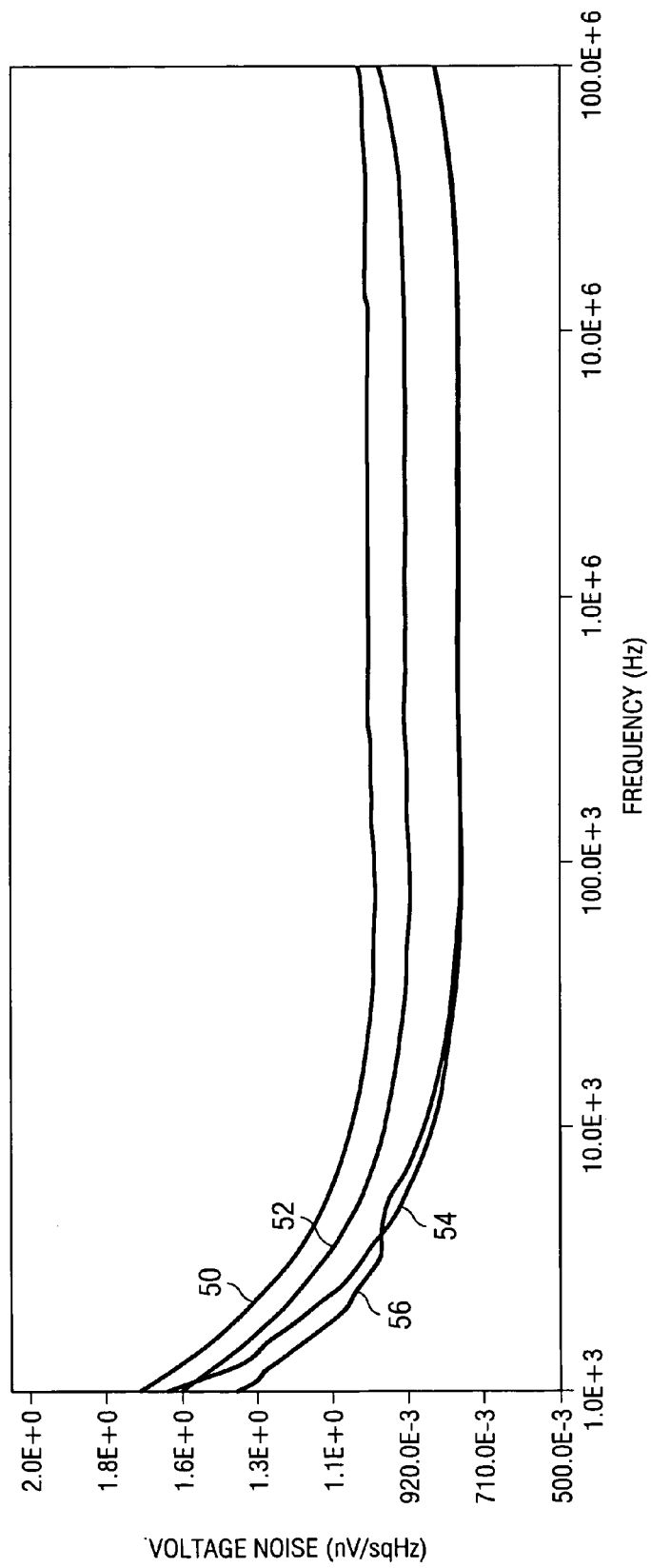
FIG. 5 is a plot of the input voltage noise versus frequency of the present invention in comparison to other designs.

FIG. 5 shows the input voltage noise for all three circuits 10, 20 and 30, plotted at 50, 52 and 54, respectively, in relation to plot 56 corresponding to the conventional circuit without dynamic biasing. As expected, the Class AB circuit 20 and the dynamically biased folded cascode circuit 10 have higher noise than circuit 30. In order to further appreciate the improvement in performance of circuit 30, a figure of merit is introduced.

$$F = \frac{SR}{V_n \times I}$$

Where SR is the slew rate, Vn is the voltage noise and I is the quiescent current. It is noted these simulation results were carried in a second generation complementary bipolar process, using the same current densities for all of the transistors in the signal chain.

Table 1 depicts the performance of the various circuits in relation to circuit 30.

TABLE 1

Performance Matrix

| Parameter | Class AB | Folded Cascode | Proposed Circuit |
|---|---|---|---|
| SR (V/us) | 1056 | 861 | 1210 |
| Vn (nVsqHz) | 0.92 | 1 | 0.77 |
| Icc (I*mA) | 36 | 23 | 34 |
| F | 31.88 | 37.43 | 46.23 |

Advantageously, circuit 30 feedback amplifiers is introduced with the advantage of having high slew rate and low noise without sacrificing power consumption.

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications.

I claim:

1. An operational amplifier, comprising:
   a dynamic biasing stage operable to convert a differential input voltage to a dynamic drive current;
   an input stage responsively coupled to the differential input voltage and the dynamic drive current, said input stage configured as a folded cascode circuit including a differential pair of transistors;
   an output gain stage responsively coupled to the differential pair of transistors and having a pair of bipolar output transistors, the output transistors having emitters each having a load resistor and being coupled to an output; and
   a compensation capacitor coupled to the output of the output gain stage and directly coupled to a supply voltage.

2. The amplifier as specified in claim 1 wherein the output gain stage transistors each have a base emitter voltage and a collector current, wherein the collector currents increase exponentially as the respective base emitter voltage increases.

3. The amplifier as specified in claim 1 wherein the output transistors are about half the size as the differential pair of transistors.

4. The amplifier as specified in claim 1 further comprising an output buffer coupled to an amplifier output.

5. An operational amplifier, comprising:
   a dynamic biasing stage operable to convert a differential input voltage to a dynamic drive current;
   an input stage responsively coupled to the differential input voltage and the dynamic drive current, said input stage configured as a folded cascode circuit including a differential pair of transistors;
   an output gain stage responsively coupled to the input stage and having a pair of transistors each having a base emitter voltage and a collector current, wherein the collector currents increase exponentially as the respective base emitter voltage increases; and
   a compensation capacitor coupled to an output of the output gain stage and directly coupled to the supply voltage.

6. The amplifier as specified in claim 5 wherein the output gain stage transistors each have a load resistor.

7. The amplifier as specified in claim 5 wherein the output gain stage transistors are about half the size as the differential pair of transistors.

8. The amplifier as specified in claim 5 further comprising an output buffer coupled to an amplifier output.

* * * * *